United States Patent [19]

Gubitose et al.

[11] 4,348,365
[45] Sep. 7, 1982

[54] CRYSTAL SEED HOLDER ASSEMBLY

[75] Inventors: Nicholas F. Gubitose, Moosic; Malcolm R. Schuler; David L. Patterson, both of Mountaintop, all of Pa.

[73] Assignee: RCA Corporation, New York, N.Y.

[21] Appl. No.: 242,046

[22] Filed: Mar. 9, 1981

[51] Int. Cl.³ .............................................. C30B 15/32
[52] U.S. Cl. ............................ 422/249; 156/617 SP; 156/DIG. 96; 156/608; 279/83; 279/86; 422/246
[58] Field of Search ............... 422/246, 249; 156/608, 156/617 SP, 621, 622, DIG. 96; 279/83, 86; 30/332, 333, 339

[56] References Cited

U.S. PATENT DOCUMENTS

| | | | |
|---|---|---|---|
| 1,738,365 | 12/1929 | Gahagan | 30/339 |
| 1,876,180 | 9/1932 | Tobin | 30/339 |
| 2,329,833 | 9/1943 | Gardella et al. | 30/339 |
| 3,078,572 | 2/1963 | Everton | 30/333 |
| 3,615,878 | 10/1971 | Chang | 156/617 SP |
| 3,795,488 | 3/1974 | Oliver | 422/249 |
| 4,284,605 | 8/1981 | Pierrat | 422/249 |

FOREIGN PATENT DOCUMENTS 53-41116 10/1978 Japan .......................... 156/DIG. 98

*Primary Examiner*—Gregory N. Clements
*Attorney, Agent, or Firm*—Birgit E. Morris; Donald S. Cohen; Robert P. Seitter

[57] ABSTRACT

A crystal seed holder assembly for retaining a crystal seed used to grow a ribbon of crystal by the EFG technique is disclosed. The holder assembly is arranged so that the seed is not subjected to fastener stress, can expand without thermal stress and can slide a limited distance relative to the holder assembly.

5 Claims, 3 Drawing Figures

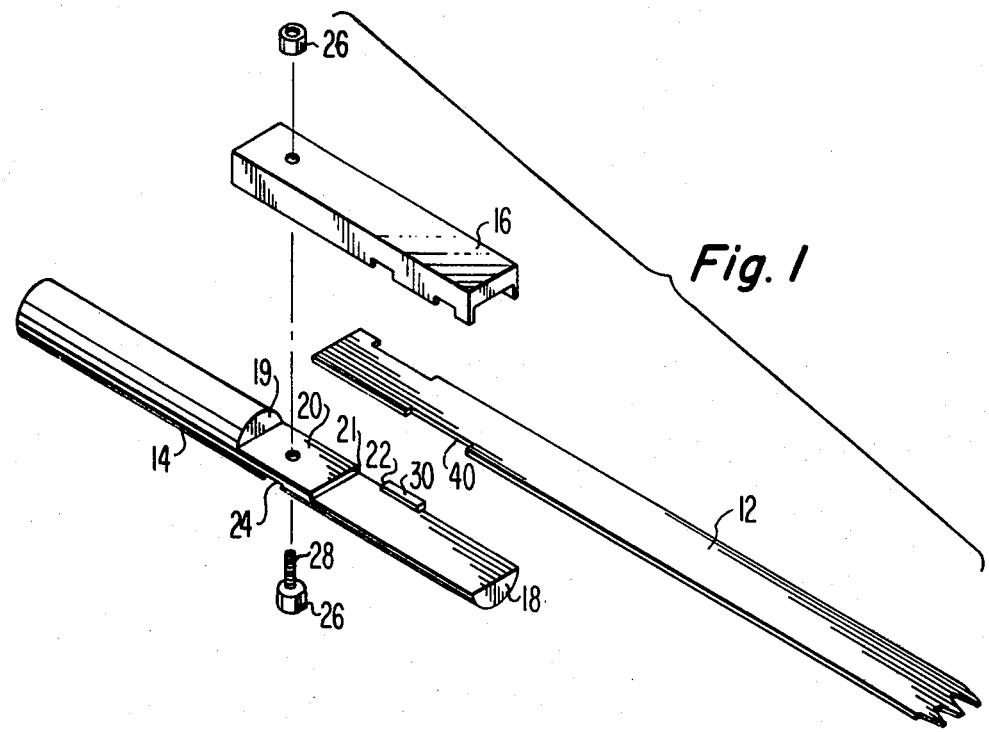
Fig. 1
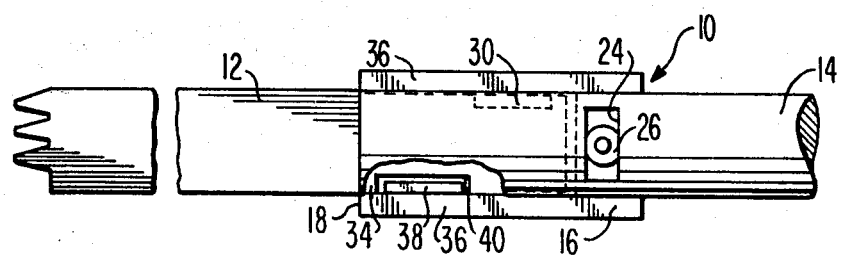
Fig. 2
Fig. 3

CRYSTAL SEED HOLDER ASSEMBLY

BACKGROUND OF THE INVENTION

This invention relates to crystal seed holder assemblies and, more particularly, to such assemblies used to grow a ribbon of crystal from a liquid melt by EFG (Edge-defined Film-fed Growth) techniques. When thus growing ribbon, a crystal seed is initially placed adjacent the growth control surfaces of a capillary passage in a conventional die member. By maintaining appropriate temperature and other conditions the liquid melt in the capillary will solidify on the seed; by pulling the seed away from the die at the appropriate speed, a crystal corresponding to the shape of the growth control surfaces is formed.

Usually, the crystal seed is formed on one end of a generally elongated, relatively flat crystalline stem, the other end of which is adapted to be clamped to a crystal pulling mechanism. In the usual clamping arrangement the end of the stem to be clamped is formed with two spaced apart holes. A seed holder forming part of the crystal pulling mechanism includes two clamp members, one for each side of the stem. These clamp members are also formed with holes and these holes are located so as to be aligned with the holes in the stem. After aligning the holes suitable fasteners are used to clamp the seed between the clamp members.

In use the clamping arrangement described above suffers from various problems. Overtightening the fasteners can cause the stem to fracture or break so that the seed is no longer usuable. An additional problem results from the fact that the rate of thermal expansion of seed material is usually significantly greater than the rate of thermal expansion of the material from which the clamp members are made. If the seed material is aluminum oxide ($Al_2O_3$) used in growing sapphire, the clamping material is generally molybdenum and the operating temperature is at least 2040° C. The rate of thermal expansion of aluminum oxide is approximately two and a half times that of molybdenum so that the seed and the seed holder experience different expansion. This can induce thermal stresses in the stem that can cause the seed to fracture or break. Another problem can occur when the seed is lowered to its initial position relative to growth control surfaces. Overtravel of the seed can occur, that is, it can be lowered too far so that the seed touches the hot growth control surfaces. If the temperature is significantly high as is the case when growing sapphire, the growth control surfaces are in a relatively plastic state such that contact of these surfaces by the seed causes the seed to embed in and damage them.

SUMMARY OF THE INVENTION

This invention provides a crystal seed holder assembly that obviates or minimizes the problems noted above. Included is a rod member having an end portion of reduced cross-section that is formed with a first generally planar surface. Also included is a clamp member formed with a second generally planar surface. The rod member and clamp member are secured together by fasteners such that the planar surfaces are adjacent each other in spaced apart relationship to define a track in which the stem portion of a crystal seed is slideably retained. At least one of the members is provided with stop means for limiting axial movement of the stem portion of the seed in the track. Preferably, the stop means is in the form of projections formed on each of the planar surfaces and those projections cooperate with slots formed in the stem portion of the crystal seed. At room temperature the slots are oversized relative to the projections so that the crystal seed can freely slide, within limits, in its track. When in use at high temperatures, the rod member, clamp members and crystal seed expand so that the planar surfaces barely touch the stem of the seed providing a very slight restraint against axial movement. The expansion is not so great so that the stop means prevents axial movement.

BRIEF DESCRIPTION OF THE DRAWING

For a better understanding of the invention, reference is made to the following description of a preferred embodiment thereof, taken in conjunction with the figures of the accompanying drawing, in which:

FIG. 1 is an exploded perspective view of a crystal seed holder and crystal seed in accordance with this invention;

FIG. 2 is a side view, with portions thereof broken away, of the crystal seed holder assembly and crystal seed illustrated in FIG. 1; and, FIG. 3 is a top plan view, with portions thereof broken away for the sake of clarity, of a crystal seed holder assembly and crystal seed illustrated in FIG. 1.

DETAILED DESCRIPTION OF A PREFERRED EMBODIMENT

Referring to the drawing, there is illustrated a crystal seed holder assembly 10 and a sapphire crystal seed 12 retained therein for use in growing a ribbon of sapphire crystal from a liquid melt of aluminum oxide ($AL_2O_3$). The crystal seed holder includes a rod member 14 and a clamp member 16 between which the crystal seed 12 is loosely retained. The rod member 14 and the clamp member 16 can be formed of any suitable material depending on the temperature to which it will be subjected. In growing sapphire ribbon, the rod member is subjected to temperatures slightly in excess of about 2040° C. and, thus, a suitable material from which these members are made is molybdenum.

One end of the rod member 14 is normally attached to a crystal pulling means (not shown) and the other end 18 is free. Extending from the free end 18, the rod member is formed with a reduced cross-section portion. Inasmuch as the rod member 14 is circular in cross section, the reduced cross section comprises a portion of approximately semi-circular cross section that forms a shoulder 19 with the circular cross section. In the preferred embodiment disclosed herein, the reduced cross section includes a first generally planar surface portion 20 that extends from the shoulder 19 toward the free end 18 and a second generally planar surface portion 22 extending from the first portion 20 to the free end. The arcuate surface around the first planar surface portion 20 is slightly greater than that around the second planar surface portion 22 so that a slight shoulder 21 is formed therebetween. For reasons to be made clear hereafter, the shoulder 21 is just slightly larger than the thickness of the crystal seed 12.

On the arcuate surface around the first planar surface portion 20 is formed a recess 24, generally rectangular in plan view that receives the flats of a first nut member 26. An opening extends through the rod member 14 and another one extends through the clamp member 16 so that a threaded pin member 28 carrying another nut member 26 can be inserted through the openings and threaded into the first nut member 26 to secure the clamp member to the rod member. For reasons to be made clear hereinafter the second planar surface portion 22 is formed with a relatively short rib member 30 extending outwardly from the plane of that surface.

The clamp member 16 is channel shaped and has a flat generally planar surface 34 from which extend a pair of side flange members 36, 36. The fasteners 26 and 28 secure the clamp member 16 and the rod member 14 together so that the first planar surface 20 and the planar surface 34 abut each other. With this arrangement the second planar surface 22 and the planar surface 34 are adjacent each other in side-by-side relationship and are spaced apart by the depth of the shoulder 21. Thus, a track is formed between the surfaces 22 and 34 that accommodates the crystal seed 12 with a loose fit to allow sliding movement. In addition, the surface 34 of the clamp member 16 is formed with a relatively short rib member 38 that extends from that surface in the same general direction as the flanges 36, 36. When the clamp member 16 and the rod member 14 are secured together, the flanges 36, 36 overlap the edges of the reduced diameter portion 18. Thus, when the seed member 12 is inserted in the track between the surfaces 22 and 34, they are retained against slippage in the plane parallel to these surfaces.

The rib members 30 and 38 function as stop means that limit the sliding movement of the crystal seed 12 relative to the rod member 14. To this end, the elongated portion of the crystal seed 12 is formed with notches 40 and 42 oriented and located so that they seat around the rib members. The notches 40 and 42 are larger than the rib members 30 and 38 so that the seed 12 can move a limited distance in the axial direction.

In use, before the crystal seed 12 is inserted into the furnace and is at room temperature, the crystal seed 12 will slide down away from the shoulder 21 so that it projects a maximum distance beyond the free end 18 of the rod member 14. As the rod member 14, clamp member 16 and seed crystal 12 are heated in the furnace, the crystal seed and planar surfaces 22 and 34 expand so that the seed may just touch these surfaces. Sliding movement of the seed in the track between the planar surfaces 22 and 34 may be slightly restrained, but only a slight force is required to slide the seed toward the shoulder 21. The thermal expansion is not sufficient to bind the rib members 30 and 38 against the notches 40 and 42.

With the crystal seed 12 thus retained, several advantages result. First, the crystal seed 12 is not subjected to any direct compressive forces from the fasteners 26 and 28 so that its tendency to fracture if these fasteners are overtightened is eliminated. Second, thermal expansion is accommodated because the notches 40 and 42 in the crystal seed are oversized relative to the size of the rib members 30 and 38. Thus, the faster expansion of the crystal seed relative to the molybdenum holder assembly does not induce thermal stresses in the seed that could cause it to fracture. Third, as the crystal seed 12 is lowered into position adjacent the growth control surfaces of the die, overtravel is accommodated. In the event the seed 12 contacts the hot growth control surfaces, it will not embed itself in these surfaces. Rather, the crystal seed will slide axially toward the shoulder 21 so that damage to the die is minimized. Fourth, orienting crystal seed 12 in the holder assembly 10 is facilitated since the ribs 30 and 38 and notches 40 and 42 automatically orient the seed.

While in the foregoing there has been described a preferred embodiment of the invention, various changes and modifications can be made without departing from the true spirit and scope of the invention as recited in the appended claims.

We claim:

1. A crystal seed holder assembly comprising a rod member having a portion of reduced cross-section adjacent one end, said portion being formed with a first generally planar surface, a clamp member formed with a second generally planar surface, fastener means securing said clamp member to said rod member with said planar surfaces being adjacent each other in spaced apart relationship to form a track, a crystal seed slideably retained in said track, and stop means for limiting movement of the crystal seed in said track, wherein said stop means includes a rib member formed on said first planar surface and a notch formed in said crystal seed for seating around said rib member.

2. A crystal seed holder assembly in accordance with claim 1 wherein said stop means further comprises a second rib member formed on said second planar surface and a second notch formed in said crystal seed for seating around said second rib member.

3. A crystal seed holder assembly in accordance with claim 2 wherein said notches are larger than said rib members.

4. A crystal seed holder assembly comprising a rod member having a portion of reduced cross-section adjacent one end, said portion being formed with a first generally planar surface, a clamp member formed with a second generally planar surface, fastener means securing said clamp member to said rod member with said planar surfaces being adjacent each other in spaced apart relationship to form a track, a crystal seed slideably retained in said track, and stop means for limiting movement of the crystal seed in said track, wherein said stop means includes a rib member formed on said second planar surface and a notch formed in said crystal seed for seating around said rib member.

5. A crystal seed holder assembly in accordance with claims 1 or 4 wherein said notch is larger than said rib member.

* * * * *